US012647123B2

(12) United States Patent
Fujisaku et al.

(10) Patent No.:    US 12,647,123 B2
(45) Date of Patent:         Jun. 2, 2026

(54) ATOMIC OSCILLATOR, CONTROL METHOD, AND CONTROL DEVICE, INCORPORATION BY REFERENCE

(71) Applicant: NEC Corporation, Tokyo (JP)

(72) Inventors: Takahiro Fujisaku, Tokyo (JP); Sota Kagami, Tokyo (JP); Kenta Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 63 days.

(21) Appl. No.: 18/746,203

(22) Filed: Jun. 18, 2024

(65) Prior Publication Data

US 2024/0429927 A1     Dec. 26, 2024

(30) Foreign Application Priority Data

Jun. 23, 2023    (JP) ................................. 2023-103292

(51) Int. Cl.
*H03L 7/26*           (2006.01)
*G04F 5/14*           (2006.01)
(52) U.S. Cl.
CPC ................ *H03L 7/26* (2013.01); *G04F 5/145* (2013.01)
(58) Field of Classification Search
CPC ........................................................ H03L 7/26
USPC ........................................................ 331/94.1
See application file for complete search history.

(56) References Cited

U.S. PATENT DOCUMENTS

| 9,935,642 B2 * | 4/2018 | Hayashi .................... G04F 5/14 |
| 12,348,237 B2 * | 7/2025 | Matsumoto ............... H03L 7/26 |
| 12,413,236 B2 * | 9/2025 | Fujisaku ................ H03B 17/00 |

FOREIGN PATENT DOCUMENTS

JP          2016-072371 A       5/2016

* cited by examiner

*Primary Examiner* — Joseph Chang
(74) *Attorney, Agent, or Firm* — Sughrue Mion, PLLC

(57)                  ABSTRACT

An atomic oscillator of the present disclosure includes: a gas cell in which alkali metal atoms are encapsulated; a light generator that applies an irradiation light having at least two different frequency components to the gas cell; a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency. The irradiation light is applied by two irradiation methods in which characteristics of change in the resonance frequency due to change in intensity of the irradiation light are mutually different. The controller controls the oscillation frequency based on a result of comparison between the resonance frequencies when the irradiation light is applied to the gas cell by the two irradiation methods, respectively.

10 Claims, 7 Drawing Sheets

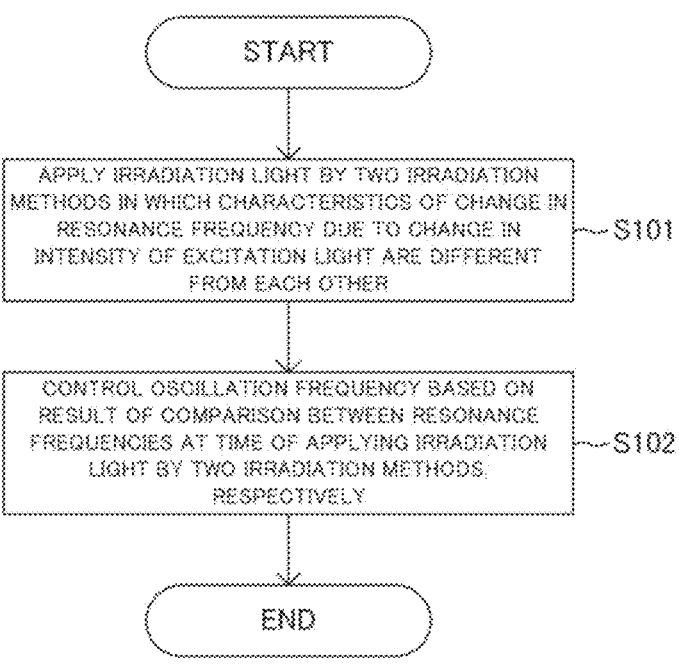

START

↓

APPLY IRRADIATION LIGHT BY TWO IRRADIATION METHODS IN WHICH CHARACTERISTICS OF CHANGE IN RESONANCE FREQUENCY DUE TO CHANGE IN INTENSITY OF EXCITATION LIGHT ARE DIFFERENT FROM EACH OTHER ~S101

↓

CONTROL OSCILLATION FREQUENCY BASED ON RESULT OF COMPARISON BETWEEN RESONANCE FREQUENCIES AT TIME OF APPLYING IRRADIATION LIGHT BY TWO IRRADIATION METHODS, RESPECTIVELY ~S102

↓

END

ATOMIC OSCILLATOR, CONTROL METHOD, AND CONTROL DEVICE, INCORPORATION BY REFERENCE

This application is based upon and claims the benefit of priority from Japanese patent application No. 2023-103292, filed on Jun. 23, 2023, the disclosure of which is incorporated herein in its entirety by reference.

TECHNICAL FIELD

The present invention relates to an atomic oscillator, a control method, a control device, and a program.

BACKGROUND ART

An atomic oscillator is a device that measures accurate time based on the natural frequency of an atom. A compact atomic clock generally measures the natural frequency of an atom using the CPT (Coherent Population Trapping), which is a quantum interference effect occurring when an alkali metal atom gas is irradiated with an excitation light having two frequencies, as the oscillation principle of an atomic oscillator. In the CPT, when the difference between the frequencies of two excitation lights matches the transition frequency between the ground levels of an alkali metal, absorption of excitation light does not occur, and the amount of transmitted light becomes larger. In the atomic oscillator using the CPT as the operation principle, the difference between the frequencies of the two excitation lights is swept and a frequency difference that maximizes the amount of transmitted light, namely, a resonance frequency is set to the natural frequency of the atom. It is one of the performance indexes of an atomic oscillator how long the natural frequency of atoms can be stably obtained.

In the measurement of the natural frequency of an atom using the CPT, a major factor that decreases the abovementioned long-term stability is a temporal change of a light shift. A light shift is a phenomenon in which the natural frequency of an atom shifts due to the interaction between the excitation light and the atom. For example, it is known that a light shift is caused by a temporal change of the intensity of the excitation light due to the aging of a laser.

Regarding the problem of light shift described above, Patent Literature 1 describes suppressing a light shift by correcting a change of the intensity of the total excitation light. Specifically, in Patent Literature 1, the intensity of the total excitation light is corrected to a constant value using two types of light sources, and thereby the occurrence of a light shift is suppressed.

Patent Literature 1: Japanese Unexamined Patent Application Publication No. JP-A 2016-072371

However, it is difficult to keep the intensity of the total excitation light perfectly constant as described in Patent Literature 1 above, and it is still difficult to suppress the occurrence of a light shift. As a result, a problem occurs that it is impossible to further increase frequency stability in an atomic oscillator.

SUMMARY OF THE INVENTION

Accordingly, an object of the present disclosure is to solve the abovementioned problem that it is impossible to further increase frequency stability in an atomic oscillator.

An atomic oscillator as an aspect of the present disclosure includes: a gas cell in which alkali metal atoms are encapsulated; a light generator that applies an irradiation light having at least two different frequency components to the gas cell; a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency. The irradiation light is applied by two irradiation methods in which characteristics of change in the resonance frequency due to change in intensity of the irradiation light are different from each other. The controller controls the oscillation frequency based on a result of comparison between the resonance frequencies when the irradiation light is applied to the gas cell by the two irradiation methods, respectively.

Further, a control method as an aspect of the present disclosure is a control method by an atomic oscillator. The atomic oscillator includes: a gas cell in which alkali metal atoms are encapsulated; a light generator that applies an irradiation light having at least two different frequency components to the gas cell; a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency. The control method includes: applying the irradiation light by two irradiation methods in which characteristics of change in the resonance frequency due to change in intensity of the irradiation light are different from each other; and by the controller, controlling the oscillation frequency based on a result of comparison between the resonance frequencies when the irradiation light is applied to the gas cell by the two irradiation methods, respectively.

Further a control device as an aspect of the present disclosure is a control device included by an atomic oscillator. The atomic oscillator includes: a gas cell in which alkali metal atoms are encapsulated; a light generator that applies an irradiation light having at least two different frequency components to the gas cell; a light detector that detects a transmitted light having transmitted by the gas cell; and the control device that determines a resonance frequency of the alkali metal atoms based on a light amount of the transmitted light by the gas cell and controls an oscillation frequency based on the determined resonance frequency. The control device controls to apply the irradiation light by two irradiation methods in which characteristics of change in the resonance frequency due to change in intensity of the irradiation light are different from each other, and controls the oscillation frequency based on a result of comparison between the resonance frequencies when the irradiation light is applied to the gas cell by the two irradiation methods, respectively.

Further, a computer program as an aspect of the present disclosure includes instructions for causing a control device included by an atomic oscillator to execute processes, the atomic oscillator including:
a gas cell in which alkali metal atoms are encapsulated;
a light generator that applies an irradiation light having at least two different frequency components to the gas cell;
a light detector that detects a transmitted light having transmitted by the gas cell; and
a controller that determines a resonance frequency of the alkali metal atoms based on a light amount of the transmitted light by the gas cell and controls an oscillation frequency based on the determined resonance frequency, the processes being to:

apply the irradiation light by two irradiation methods in which characteristics of change in the resonance frequency due to change in intensity of the irradiation light are different from each other, and control the oscillation frequency based on a result of comparison between the resonance frequencies when the irradiation light is applied to the gas cell by the two irradiation methods, respectively.

With the configurations as described above, the present disclosure can further increase frequency stability in an atomic oscillator.

BRIEF DESCRIPTION OF DRAWINGS

FIG. 1 is a block diagram showing the configuration of an atomic oscillator in the present disclosure;

FIG. 7 is a flowchart showing the operation of the second atomic oscillator in the present disclosure.

EXAMPLE EMBODIMENTS

First Example Embodiment

Figure 2:
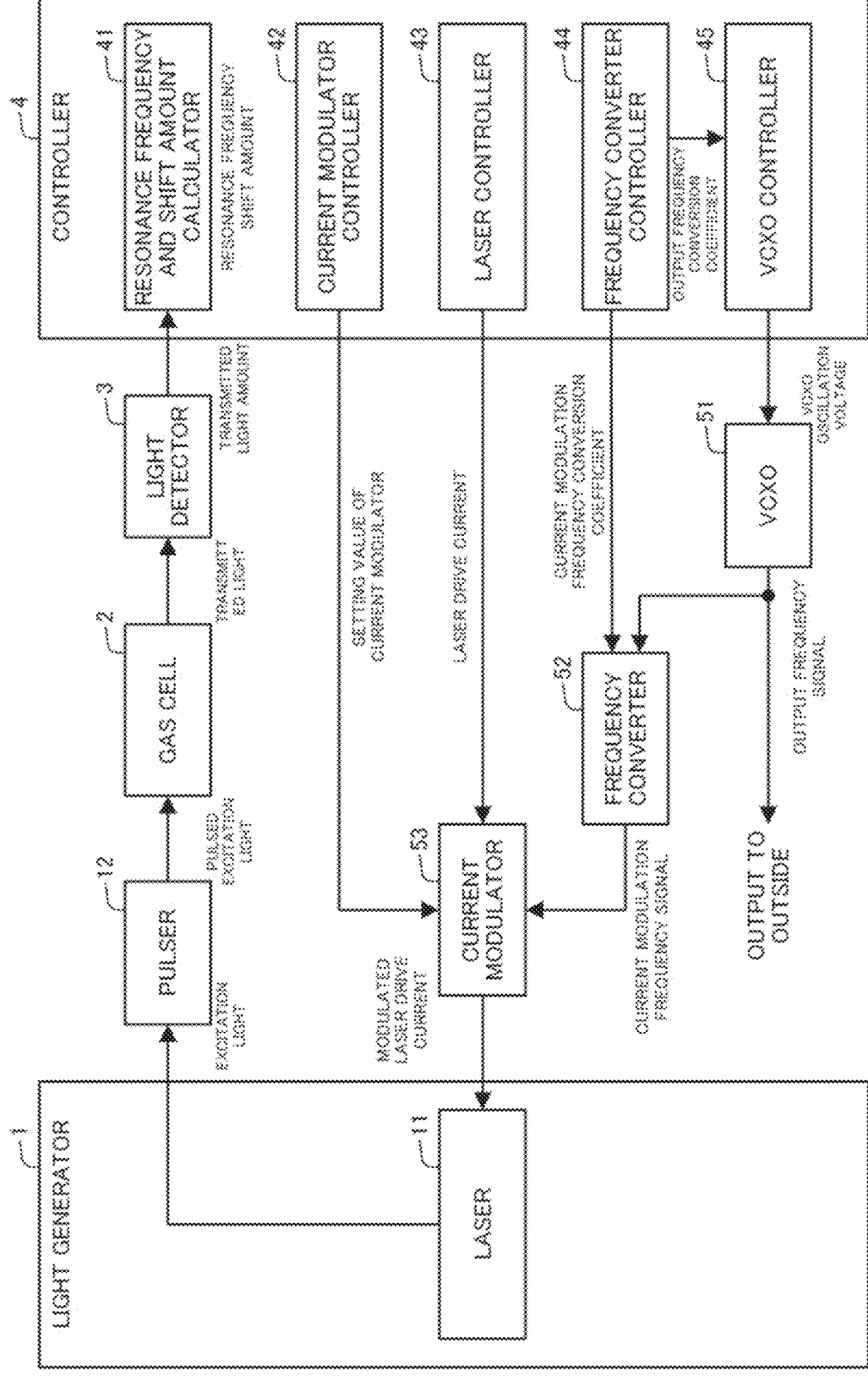
FIG. 2 is a view showing signals output from the respective components of the atomic oscillator in the present disclosure.

A first example embodiment of the present disclosure will be described with reference to the drawings. The drawings can relate to all the example embodiments.

[Configuration]

Figure 1:
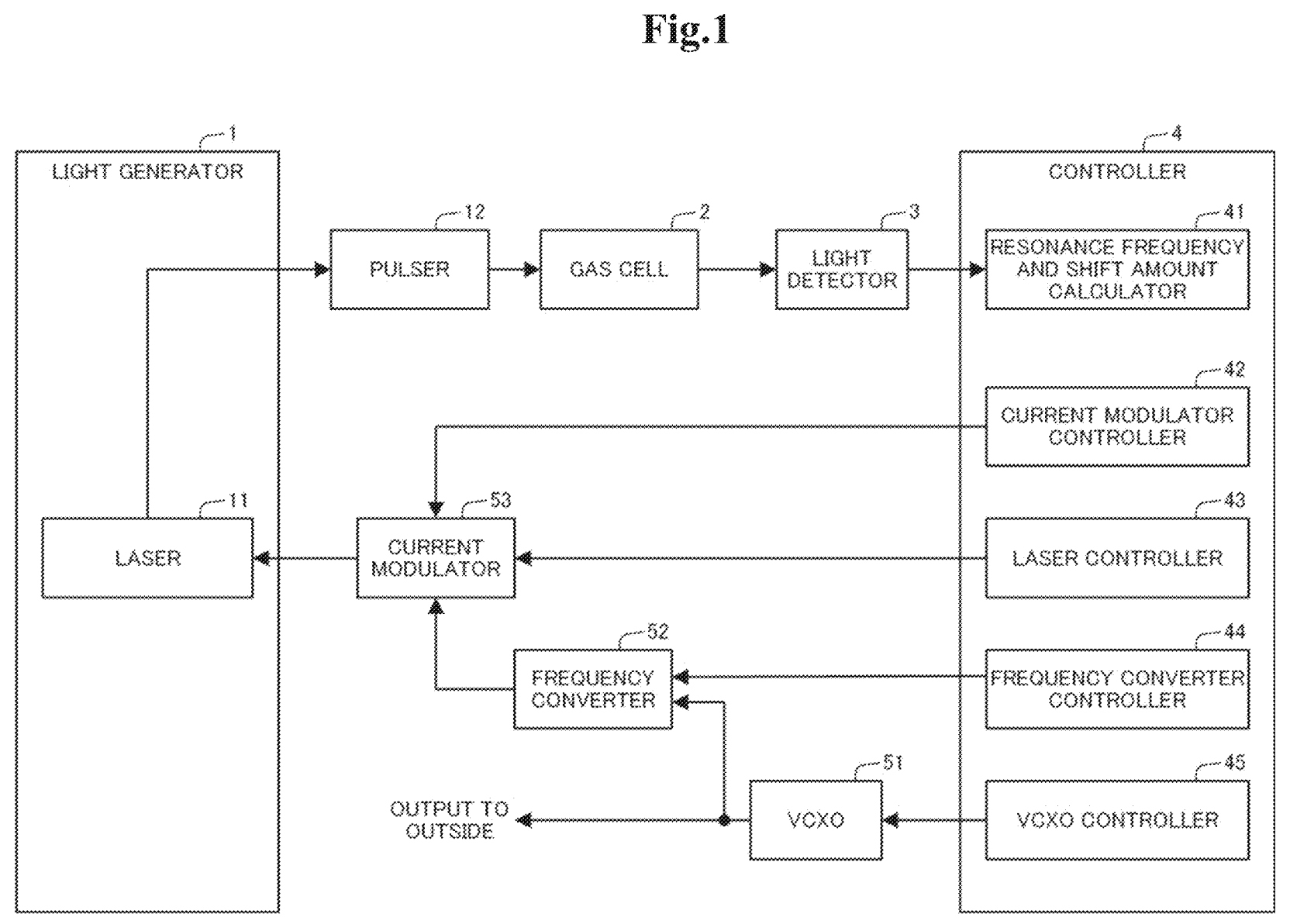

FIG. 1 is a block diagram showing the configuration of an atomic oscillator in this example embodiment. The atomic oscillator in this example embodiment includes a light generator 1, a gas cell 2, a light detector 3, a controller 4, a VCXO (Voltage Controlled Crystal Oscillator) 51, a frequency converter 52, and a current modulator 53. Then, the light generator 1 includes a laser 11 that emits an excitation light, and the atomic oscillator further includes a pulser 12 that pulses the excitation light from the laser 11. Moreover, the controller 4 includes a resonance frequency and shift amount calculator 41, a current modulator controller 42, a laser controller 43, a frequency converter controller 44, and a VCXO controller 45. The controller 4 is configured with an information processing device (a control device) including an arithmetic logic unit and a memory unit, and the respective parts 41 to 45 of the controller 4 are realized by execution of a program by the arithmetic logic unit. The respective components will be described in detail below.

The light generator 1 generates two excitation lights (irradiation lights) including at least two different frequency components by performing frequency modulation from a single wavelength excitation light in cooperation with the controller 4, the VCXO 51, the frequency converter 52 and the current modulator 53, and applies to the gas cell 2. FIG. 2 shows signals output from the respective components of the atomic oscillator. As shown in this figure, a current modulation frequency conversion coefficient and an output frequency conversion coefficient that are set in advance are output from the frequency converter controller 44 and, by output of a VCXO oscillation voltage based on the output frequency conversion coefficient from the VCXO controller 45, the oscillation frequency of an output frequency signal that is output from the VCXO 51 and becomes an external output is controlled. Moreover, the output frequency signal output from the VCXO 51 is subject to frequency conversion by the frequency converter 52 based on the current modulation frequency conversion coefficient and, for example, a current modulation frequency signal around 9.2 GHz corresponding to the transition frequency between the ground levels of a cesium atom is output. Then, a laser drive current output from the laser controller 43 is modulated by the current modulator 53 based on the setting value of the current modulator 53 output from the current modulator controller 42, and thereby the laser 11 is driven by the modulated laser drive current. Consequently, two excitation lights with different frequencies are generated by the light generator 1, the difference between the frequencies of the two excitation lights is swept around 9.2 GHz by change of the setting value of the current modulator 53, and the excitation lights are applied to the gas cell 2. Since the configuration and method for generating an excitation light by the light generator 1 of the atomic oscillator are known, a detailed description thereof will be omitted.

Herein, the values of "current modulation frequency conversion coefficient" and "output frequency conversion coefficient" described above are set in advance, respectively, and are stored in the frequency converter controller 44. However, in this example embodiment, the shift amount of a resonance frequency is calculated as will be described later, and the values of "current modulation frequency conversion coefficient" and "output frequency conversion coefficient" are changed to values corresponding to the shift amount. This will be discussed later.

In the gas cell 2, alkali metal atoms are encapsulated. The alkali metal atoms may be any alkali metal atoms such as cesium atoms, rubidium atoms, sodium atoms, and potassium atoms. As an example, in the gas cell 2, cesium atoms are encapsulated as the alkali metal atoms, nitrogen is used as the buffer gas, and the gas pressure is 1 kPa.

The light detector 3 detects transmitted lights transmitted by the gas cell 2 described above, and measures the amounts of the transmitted lights. At this time, since the excitation lights are applied while the setting values in frequency modulation are being changed, the light detector 3 passes the measured transmitted light amounts to the controller 4 so that the measured transmitted light amounts are recorded in association with the changed setting values, namely, the swept frequency difference.

Figure 3:
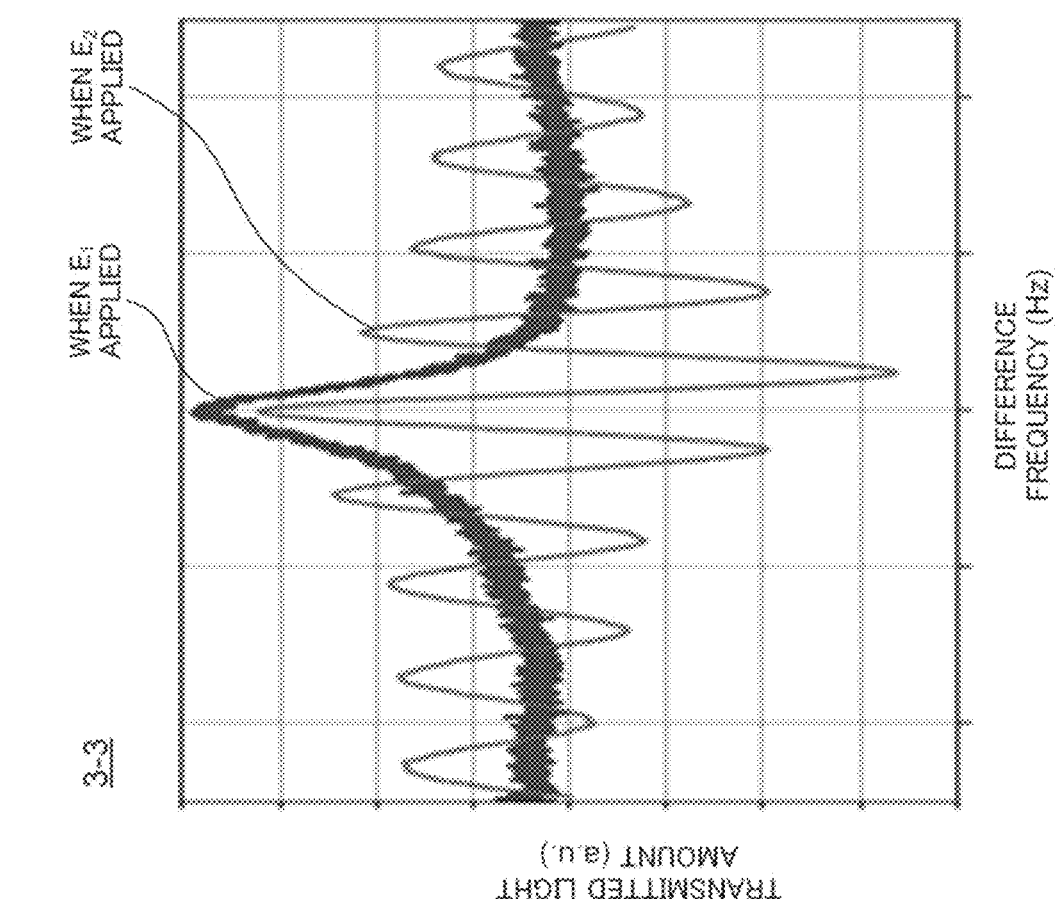
FIG. 3 is a view showing an aspect of processing by the atomic oscillator in the present disclosure.
Figure 3:
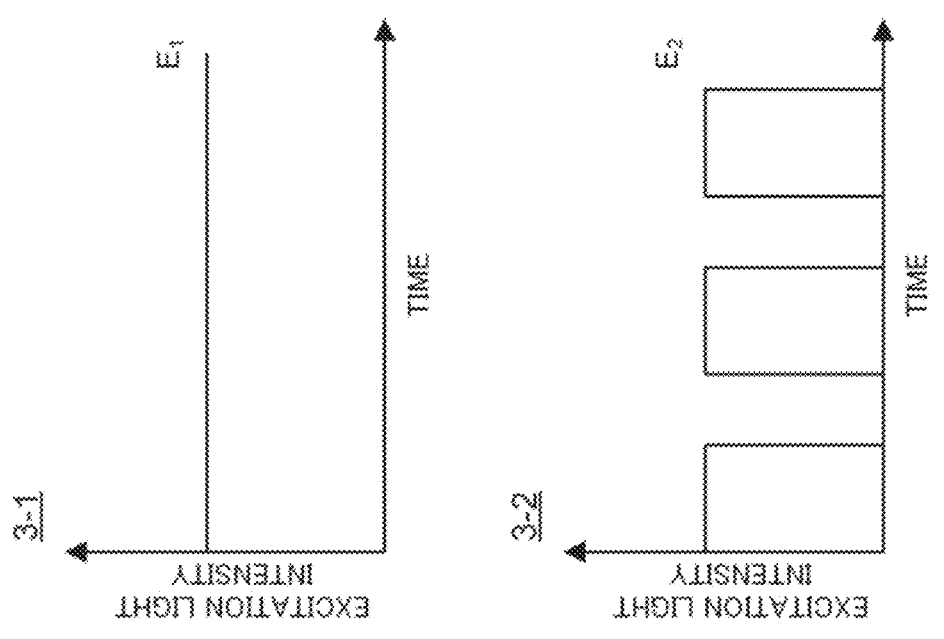

In this example embodiment, the light generator 1 is configured to apply excitation light in two irradiation modes (irradiation methods) under control of the controller 4. Specifically, a first mode is a CW (Continuous wave) mode in which an excitation light $E_1$ as a continuous wave with constant excitation light intensity with respect to the time axis is applied as shown in FIG. 3 (3-1). A second mode is a CPT-Ramsey mode in which a pulsed excitation light $E_2$ as a square wave excitation light with respect to the time axis is applied as shown in FIG. 3 (3-2). At this time, in the CPT-Ramsey mode that is the second mode, the excitation light generated from the light generator 1 is pulsed by the pulser 12 under the control of the controller 4. The pulser 12 is configured with, for example, an acousto-optic modulator (AOM).

Then, in response to applying the excitation light in the two irradiation modes, the light detector 3 measures the amount of the transmitted light in each of the two irradiation modes. Consequently, as shown in FIG. 3 (3-3), the light detector 3 measures so that a graph of transmitted light amount when the continuous wave excitation light $E_1$ is applied in the CW mode and a graph of transmitted light amount when the pulsed excitation light $E_2$ is applied in the CPT-Ramsey mode are recorded by the controller 4. Regarding the excitation light $E_2$ pulsed in the CPT-Ramsey mode, the light detector 3 can measure the amount of transmitted light by being controlled to turn on within the time that the excitation light is on and measure the amount of transmitted light.

Figure 4:
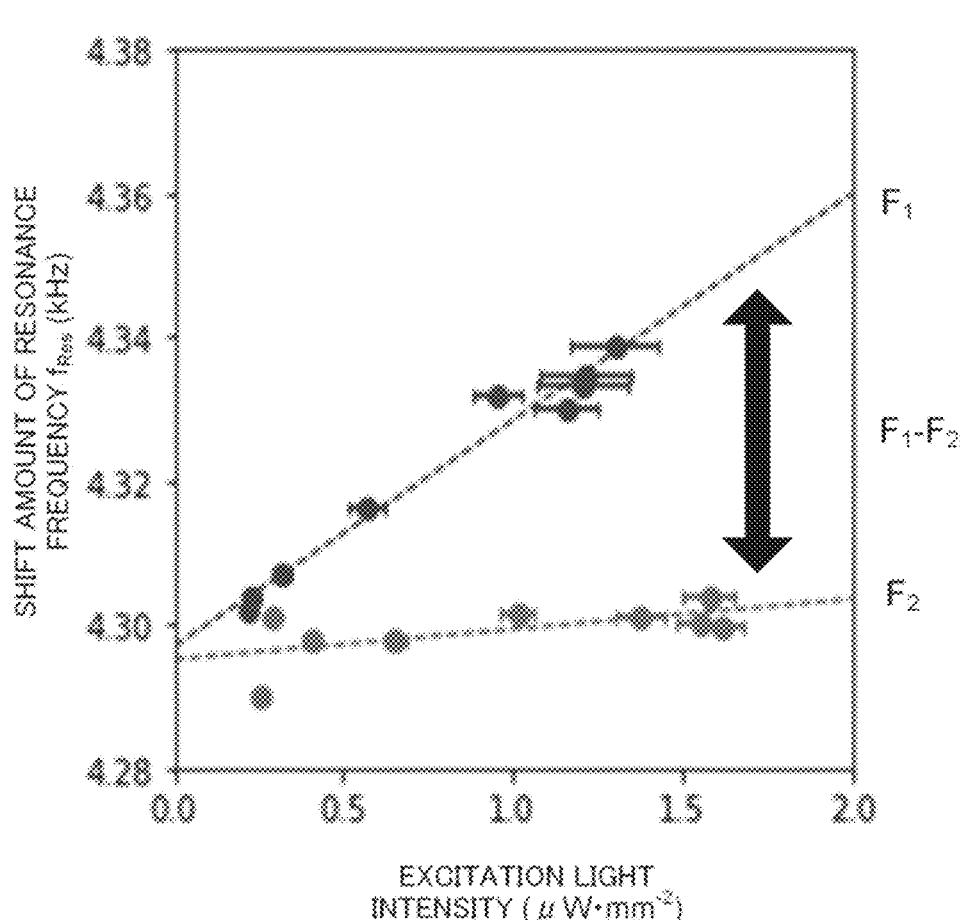
FIG. 4 is a view showing an aspect of processing by the atomic oscillator in the present disclosure.

It is known that, in the atomic oscillator utilizing the CPT, in the CPT-Ramsey method that the pulsed excitation light $E_2$ is applied to the gas cell 2, a shift amount in natural frequency of the alkali metal atoms due to a change in intensity of the excitation light is reduced. FIG. 4 shows a change in resonance frequency $F_1$ when the continuous wave excitation light $E_1$ in the CW mode is applied and a change in resonance frequency $F_2$ when the pulsed excitation light $E_2$ in the CPT-Ramsey mode is applied with respect to a change in intensity of the excitation light. In this figure, the slope of the resonance frequency with respect to the intensity of the excitation light is 32 Hz/($\mu$W·mm$^{-2}$) for the continuous wave excitation light $E_1$, and is 4.2 Hz/($\mu$W·mm$^{-2}$) for the pulsed excitation light $E_2$. Thus, the characteristics of the change in resonance frequency due to the change in intensity of the excitation light are different between in the case of the CW mode and the CPT-Ramsey mode.

Although excitation light is applied in two irradiation modes, the CW mode and the CPT-Ramsey mode in this example embodiment, excitation light may be applied in the CPT-Ramsey mode in both the two irradiation modes. In this case, by setting the duty cycles of the pulsed excitation lights in the respective CPT-Ramsey modes to different values, the characteristics of resonance frequencies measured when the excitation light is applied in the respective CPT-Ramsey modes, particularly, the characteristics of changes in resonance frequencies due to change in intensity of the excitation light become different from each other. However, the two irradiation modes are not necessarily limited to the abovementioned irradiation methods, and it is sufficient that the characteristics of changes in resonance frequencies measured from the excitation light applied in the respective irradiation methods, namely, the characteristics of changes in resonance frequency due to change in intensity of the excitation light are different from each other.

The resonance frequency and shift amount calculator 41 of the controller 4 determines a resonance frequency based on the transmitted light amount measured by the light detector 3 in each of the irradiation modes. That is to say, the resonance frequency and shift amount calculator 41 determines a resonance frequency $F_1$ corresponding to the CW mode and a resonance frequency $F_2$ corresponding to the CPT-Ramsey mode. For example, the resonance frequency and shift amount calculator 41 may set difference frequencies at which the respective transmitted light amounts are the maximum as the resonance frequencies $F_1$ and $F_2$ in the respective graphs shown in FIG. 3 (3-3), or may set difference frequencies at which the slope of a transmitted light amount graph with respect to a frequency difference is zero as the resonance frequencies by differential waveform measurement of transmitted light amount.

Then, the controller 4 controls the oscillation frequency based on at least one or both of the resonance frequencies $F_1$ and $F_2$. For example, the controller 4 controls the oscillation frequency using the resonance frequency $F_1$ determined for the CW mode at the time of applying the excitation light in the CW mode, and controls the oscillation frequency using the resonance frequency $F_2$ determined for the CPT-Ramsey mode at the time of applying the excitation light in the CPT-Ramsey mode. Specifically, the controller 4 controls in the VCXO controller 45 the oscillation frequency of an output frequency signal output by the VCXO 51 based on the determined resonance frequencies $F_1$ and $F_2$ and an output frequency conversion coefficient (a first parameter) stored in advance in the frequency converter controller 44. As an example, it is assumed that the VCXO 51 outputs an output frequency signal of 10 MHz in the atomic oscillator, and it is assumed that the determined resonance frequency $F_1$ for the CW mode is "9.192631 GHz" and the preset output frequency conversion coefficient is "(10 MHz)/ (9.192631 GHz)". In this case, the VCXO 51 outputs an output frequency signal of (9.192631 GHz)*(10 MHz)/ (9.192631 GHz)=10 MHz. Consequently, an output frequency signal of 10 MHz is output from the atomic oscillator to the outside and is also input to the frequency converter 52. Moreover, at this time, assuming that a preset current modulation frequency conversion coefficient (a second parameter) is "(9.192631 GHz)/(10 MHZ)", a current modulation frequency signal of (10 MHz)*(9.192631 GHz)/(10 MHz)=9.192631 GHz is generated by the frequency converter 52. That is to say, a reference signal that serves as a reference for the irradiation light is generated and input to the current modulator 53. The values of the output frequency conversion coefficient and the current modulation frequency conversion coefficient are preset and stored based on the oscillation frequency of the output frequency signal assumed to be output by the VCXO 51 in the atomic oscillator and the characteristics of resonance frequency in each of the irradiation modes and excitation light intensity.

The controller 4 in this example embodiment is further configured to control the oscillation frequency based on the result of comparison between the determined resonance frequencies $F_1$ and $F_2$ for the respective irradiation modes as will be described later in order to deal with the variations of the resonance frequencies $F_1$ and $F_2$ for the respective irradiation modes due to a change in intensity of the excitation light.

Here, the resonance frequency and shift amount calculator 41 calculates the difference between the resonance frequencies $F_1$ and $F_2$ determined in the CW mode and the CPT-Ramsey mode, and calculates a light shift amount, which is the variation amount of resonance frequency with respect to a change in intensity of excitation light based on the difference between the resonance frequencies $F_1$ and $F_2$. Specifically, first, the resonance frequency and shift amount calculator 41 stores in advance a graph representing the relation between a difference ($F_1$–$F_2$) of the resonance frequencies $F_1$ and $F_2$ in the CW mode and the CPT-Ramsey mode and the intensity of excitation light as shown in FIG. 4. The graph as shown in FIG. 4 is created based on the characteristics of resonance frequencies in the respective irradiation modes and excitation light intensity and stored in advance. In addition, the resonance frequency and shift amount calculator 41 stores data representing the relation between excitation light intensity and a light shift amount that is the variation amount of resonance frequency in each of the irradiation modes. Specifically, the data on light shift amount with respect to excitation light intensity is represented by correspondence data of excitation light intensity to output frequency conversion coefficient and correspondence data of excitation light intensity to current modulation frequency conversion coefficient, and correspondence data including a correspondence table or a correspondence graph is generated and stored in advance. The correspondence data of excitation light intensity to output frequency conversion coefficient, and the correspondence data of excitation light intensity to current modulation frequency conversion coefficient are generated and stored in advance based on the oscillation frequency of an output frequency signal that is assumed to be output by the VCXO 51 in the atomic oscillator, and the characteristics of the shift amount of resonance frequency in each of the irradiation modes and the excitation light intensity.

Then, based on the graph and the correspondence data stored as mentioned above, the resonance frequency and shift amount calculator 41 specifies an excitation light intensity from the measured difference $(F_1-F_2)$ in resonance frequency between in the CW mode and in the CPT-Ramsey mode, and specifies an output frequency conversion coefficient and a current modulation frequency conversion coefficient from the excitation light intensity. The resonance frequency and shift amount calculator 41 performs light shift correction by changing and updating the output frequency conversion coefficient and the current modulation frequency conversion coefficient stored in the frequency converter controller 44 to the output frequency conversion coefficient and the current modulation frequency conversion coefficient that have been newly specified.

Then, the controller 4 controls the oscillation frequency based on the resonance frequencies $F_1$ and $F_2$ determined in the respective irradiation modes in the same manner as described above, using the output frequency conversion coefficient and the current modulation frequency conversion coefficient updated by the light shift correction described above. For example, in applying the excitation light in the CW mode, the controller 4 controls the oscillation frequency using the resonance frequency $F_1$ determined in the CW mode and, in applying the excitation light in the CPT-Ramsey mode, the controller 4 controls the oscillation frequency using the resonance frequency $F_2$ determined in the CPT-Ramsey mode. Here, as an example, in a case where the resonant frequency $F_1$ in the CW mode varies from "9.192631 GHz" to "9.192632 GHz" due to a light shift, a case of not correcting the output frequency conversion coefficient and the current modulation frequency conversion coefficient described above and a case of correcting will be described.

First, in a case where the correction is not performed, the output frequency conversion coefficient remains at "(10 MHZ)/(9.192631 GHz)", and an output frequency signal of (9.192632 GHz)*(10 MHZ)/(9.192631 GHz)=10.0000011 MHz is output from the VCXO 51 using the light-shifted resonance frequency (9.192632 GHz) of the gas cell 2. Moreover, the current modulation frequency conversion coefficient remains at "(9.192631 GHz)/(10 MHz)", and a current modulation frequency signal of (10.0000011 MHz) *(9.192631 GHz)/(10 MHz)=9.192632 GHz is output from the frequency converter 52. Therefore, although the atomic oscillator intends to perform frequency modulation on the excitation light at "9.192631 GHz" and output an output frequency signal of "10 MHz" to the outside, the atomic oscillator in reality performs frequency modulation at "9.192632 GHz" and outputs an output frequency signal of "10.0000011 MHz" to the outside.

In contrast, in a case where the light shift correction is performed as described above, the output frequency conversion coefficient is updated to "(10 MHz)/(9.192632 GHz)", and an output frequency signal of (9.192632 GHz)*(10 MHz)/(9.192632 GHz)=10 MHz is output from the VCXO

51, using the light-shifted resonance frequency (9.192632 GHz) of the gas cell 2. Moreover, the current modulation frequency conversion coefficient is updated to "(9.192632 GHz)/(10 MHz)", and a current modulation frequency signal of (10 MHZ)*(9.192632 GHz)/(10 MHz)=9.192632 GHz is output from the frequency converter 52. Therefore, the atomic oscillator performs frequency modulation on the excitation light with the resonance frequency of "9.192632 GHz" and outputs an output frequency signal of "10 MHz" to the outside.

Thus, the atomic oscillator described above can reduce the influence of a change in output frequency signal due to a light shift by correcting the output frequency signal by not restoring the intensity of the excitation light to the original one but keeping the intensity of the excitation light without change and changing the output frequency conversion coefficient by an amount corresponding to a change in resonance frequency due to the light shift.

Instead of the correspondence data of the intensity of excitation light to an output frequency conversion coefficient and the correspondence data of the intensity of excitation light to a current modulation frequency conversion coefficient, the controller 4 may store correspondence data of a difference between the resonance frequencies $F_1$ and $F_2$ to an output frequency conversion coefficient or a current modulation frequency conversion coefficient, and may store correspondence data of a difference between the resonance frequencies $F_1$ and $F_2$ to the variation amount of each of the resonance frequencies $F_1$ and $F_2$, and an expression for calculating the variation amount of each of the resonance frequencies $F_1$ and $F_2$ and an output frequency conversion coefficient or a current modulation frequency conversion coefficient from the difference between the resonance frequencies $F_1$ and $F_2$. Then, controller 4 may calculate the light shift amounts of the respective resonance frequencies $F_1$ and $F_2$ from the difference between the resonance frequencies $F_1$ and $F_2$ based on the correspondence data and the calculation expression, and control the oscillation frequency based on the value.

[Operation]

Next, the operation of the atomic oscillator described above, particularly, the operation when correcting a light shift of a resonance frequency will be described.

Figure 5:
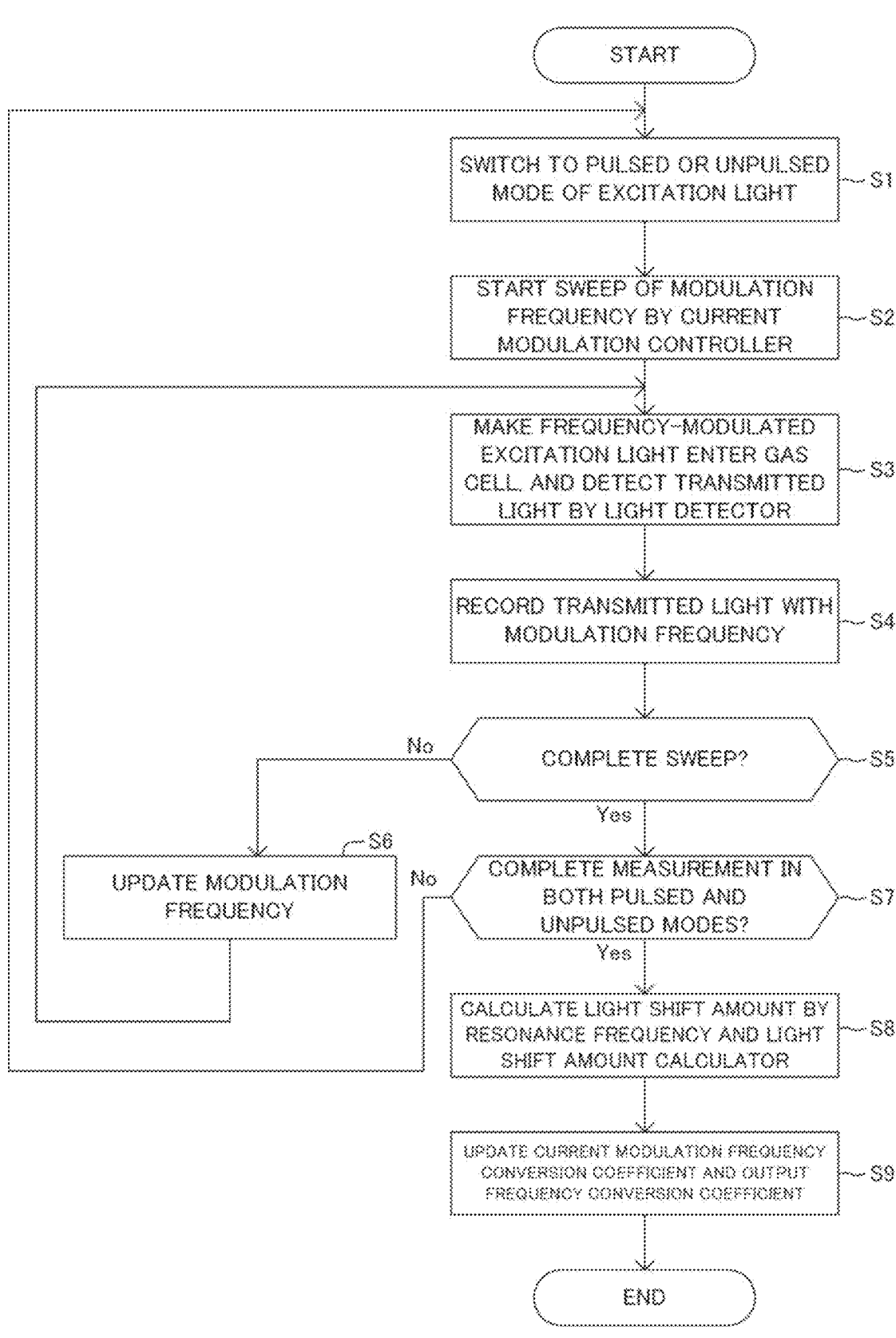
FIG. 5 is a flowchart showing the processing operation of the atomic oscillator in the present disclosure.

First, the controller 4 switches the excitation light irradiation mode to the CW mode or the CPT-Ramsey mode (step S1 of FIG. 5). For example, the controller 4 first sets to the CW mode to apply a continuous wave excitation light that is not pulsed. Then, the controller 4 sets the respective setting values, and the light generator 1 generates an excitation light including at least two different frequency components. At this time, the current modulator controller 42 of the controller 4 changes and sweeps the modulation frequency, for example, around 9.2 GHz corresponding to the transition frequency between the ground levels of cesium atom (step S2 of FIG. 5).

Then, the excitation light in the CW mode generated by the light generator 1 is applied to the gas cell 2, and the light detector 3 detects a transmitted light (step S3 of FIG. 5). At this time, the controller 4 stores the measured amount of the transmitted light in association with the modulation frequency (step S4 of FIG. 5). Then, until the sweep of the modulation frequency and the measurement of the transmitted light amount are completed, the abovementioned process is repeated (No at step S5 and step S6 of FIG. 5).

When the measurement of the transmitted light amount at the swept modulation frequency is completed (Yes at step S5 of FIG. 5), the controller 4 checks whether the measurement is completed in all the irradiation modes (step S7 of FIG. 5). In this case, since the measurement in the CPT-Ramsey mode is not completed (No at step S7 of FIG. 5), the controller 4 switches the excitation light irradiation mode to the CPT-Ramsey mode (step S1 of FIG. 5). Then, in the same manner as described above, the controller 4 sets the respective setting values, and the light generator 1 generates an excitation light including at least two different frequency components. At this time, the current modulator controller 42 of the controller 4 changes and sweeps the modulation frequency, for example, around 9.2 GHz corresponding to the transition frequency between the ground levels of cesium atom (step S2 of FIG. 5).

Then, the pulsed excitation light in the CPT-Ramsey mode generated by the light generator 1 is applied to the gas cell 2, and the light detector 3 detects a transmitted light (step S3 of FIG. 5). At this time, the controller 4 stores the measured amount of the transmitted light in association with the modulation frequency (step S4 of FIG. 5). Then, until the sweep of the modulation frequency and the measurement of the transmitted light amount are completed, the abovementioned process is repeated (No at step S5 of FIG. 5, step S6 of FIG. 5).

At any timing after the measurement of the transmitted light amount at the swept modulation frequency is completed in all the irradiation modes (Yes at step S7 of FIG. 5), the controller 4 performs light shift correction in the following manner. First, the controller 4 determines the resonance frequencies $F_1$ and $F_2$ in the respective irradiation modes based on the transmitted light amounts corresponding to the respective irradiation modes passed from the light detector 3. Then, the controller 4 calculates the difference between the determined resonance frequencies $F_1$ and $F_2$ in the respective irradiation modes, and calculates a light shift amount, which is the variation amount of resonance frequency to the intensity of excitation light, based on the difference between the resonance frequencies $F_1$ and $F_2$ (step S8 of FIG. 5). For example, the controller 4 specifies the intensity of excitation light based on a graph representing the relation between the difference between the resonance frequencies $F_1$ and $F_2$ in the respective irradiation modes and the intensity of excitation light as shown in FIG. 4. Furthermore, the controller 4 specifies an output frequency conversion coefficient and a current modulation frequency conversion coefficient corresponding to the specified intensity of excitation light based on correspondence data of the intensity of excitation light with respect to output frequency conversion coefficient and a correspondence table of the intensity of excitation light with respect to current modulation frequency conversion coefficient.

Then, the controller 4 updates the stored output frequency conversion coefficient and current modulation frequency conversion coefficient to the newly specified output frequency conversion coefficient and current modulation frequency conversion coefficient (step S9 of FIG. 5). After that, by controlling the oscillation frequency from the VCXO 45 using the output frequency conversion coefficient and current modulation frequency conversion coefficient updated by the light shift correction, the atomic oscillator can appropriately deal with the light shift.

Thus, according to the atomic oscillator of the present disclosure, it is possible to appropriately deal with a light shift, which is variation of resonance frequency due to a change in intensity of excitation light, and it is possible to increase frequency stability.

Second Example Embodiment

Next, a second example embodiment of the present disclosure will be described. In this example embodiment, the overview of the configurations of the atomic oscillator and the control method described in the above example embodiment.

Figure 6:
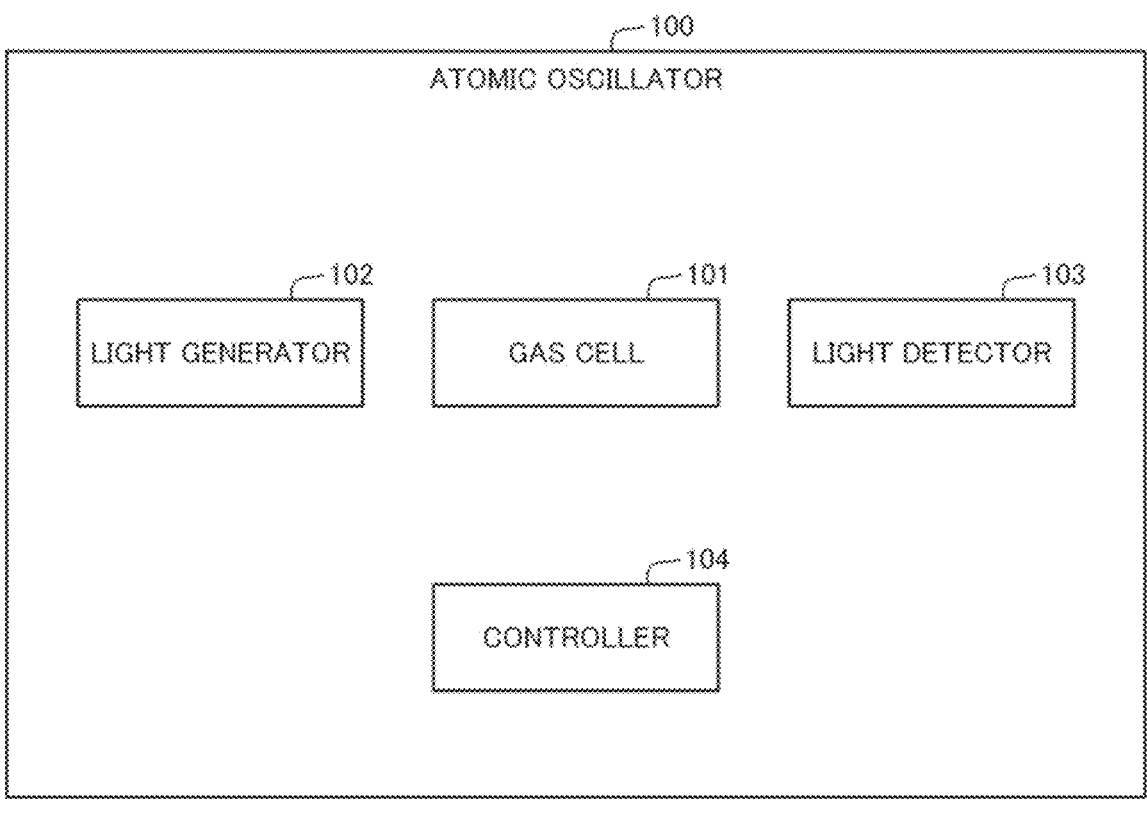
FIG. 6 is a block diagram showing the configuration of a second atomic oscillator in the present disclosure.

As shown in FIG. 6, an atomic oscillator 100 in this example embodiment includes a gas cell 101 in which alkali metal atoms are encapsulated, a light generator 102 that applies an irradiation light having at least two different frequency components to the gas cell, a light detector 103 that detects a transmitted light having transmitted by the gas cell, and a controller 104 that determines the resonance frequency of the alkali metal atoms based on the light amount of the transmitted light by the gas cell and controls an oscillation frequency based on the determined resonance frequency.

Then, as shown in FIG. 7, the controller 104 with the above configuration (a control device) first applies an irradiation light by two irradiation methods in which the characteristics of change in resonance frequency due to change in intensity of irradiation light are different from each other (step S101). After that, the controller 104 controls an oscillation frequency based on the result of comparison between resonance frequencies at the time of applying the irradiation light to the gas cell by the two irradiation methods, respectively (step S102).

Accordingly, the atomic oscillator in the present disclosure can appropriately deal with a light shift, which is variation of a resonance frequency due to a change in intensity of an excitation light, and can increase frequency stability.

Although the present invention has been described above with reference to the example embodiments and so forth, the present invention is not limited to the above example embodiments. The configurations and details of the present invention can be changed in various manners that can be understood by one skilled in the art within the scope of the present invention.

<Supplementary Notes>

The whole or part of the example embodiments disclosed above can be described as the following supplementary notes. Below, the overview of the configurations of an atomic oscillator, a control method, a control device, and a program in the present invention will be described. However, the present invention is not limited to the following configurations.

(Supplementary Note 1)

An atomic oscillator comprising:

a gas cell in which alkali metal atoms are encapsulated;

a light generator that applies an irradiation light having at least two different frequency components to the gas cell;

a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency, wherein:

the irradiation light is applied by two irradiation methods in which characteristics of change in the resonance frequency due to change in intensity of the irradiation light are different from each other; and the controller controls the oscillation frequency based on a result of comparison between the resonance frequencies when the irradiation light is applied to the gas cell by the two irradiation methods, respectively.

(Supplementary Note 2)

11

The atomic oscillator according to Supplementary Note 1, further comprising a pulser that pulses the irradiation light, wherein at least one of the two irradiation methods is to apply the irradiation light pulsed by the pulser.

(Supplementary Note 3)

The atomic oscillator according to Supplementary Note 2, wherein one of the two irradiation methods is to apply the irradiation light pulsed by the pulser and another one of the two irradiation methods is to apply the irradiation light that is not pulsed.

(Supplementary Note 4)

The atomic oscillator according to Supplementary Note 2, wherein one of the two irradiation methods is to apply a first irradiation light pulsed by the pulser and another one of the two irradiation methods is to apply a second irradiation light pulsed by the pulser at a different duty cycle from that of the first irradiation light.

(Supplementary Note 5)

The atomic oscillator according to any of Supplementary Notes 1 to 4, wherein the controller controls the oscillation frequency based on a difference in the resonance frequency when the irradiation light is applied to the gas cell by the two irradiation methods, respectively.

(Supplementary Note 6)

The atomic oscillator according to Supplementary Note 5, wherein the controller calculates a variation amount of the resonance frequency of the alkali metal atoms due to a change in intensity of the irradiation light based on the difference in the resonance frequency when the irradiation light is applied to the gas cell by the two irradiation methods, respectively, and controls the oscillation frequency in accordance with the calculated variation amount.

(Supplementary Note 7)

The atomic oscillator according to Supplementary Note 5 or 6, wherein the controller controls the oscillation frequency based on the resonance frequency of the alkali metal atoms and a preset first parameter, and also changes the first parameter based on the difference in the resonance frequency when the irradiation light is applied to the gas cell by the two irradiation methods, respectively, and controls the oscillation frequency based on the changed first parameter and the resonance frequency.

(Supplementary Note 8)

The atomic oscillator according to any of Supplementary Notes 5 to 7, wherein the controller controls to generate a reference signal to be a reference of the irradiation light based on the oscillation frequency and a preset second parameter, and also changes the second parameter based on the difference in the resonance frequency when the irradiation light is applied to the gas cell by the two irradiation methods, respectively, and controls to generate the reference signal based on the changed second parameter and the oscillation frequency.

(Supplementary Note 9)

A control method by an atomic oscillator, the atomic oscillator including:

a gas cell in which alkali metal atoms are encapsulated;

12 a light generator that applies an irradiation light having at least two different frequency components to the gas cell;

a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency, the control method comprising:

applying the irradiation light by two irradiation methods in which characteristics of change in the resonance frequency due to change in intensity of the irradiation light are different from each other; and by the controller, controlling the oscillation frequency based on a result of comparison between the resonance frequencies when the irradiation light is applied to the gas cell by the two irradiation methods, respectively.

(Supplementary Note 9.1)

The control method according to Supplementary Note 9, comprising applying the irradiation light pulsed by a pulser in at least one of the two irradiation methods.

(Supplementary Note 9.2)

The control method according to Supplementary Note 9, comprising applying the irradiation light pulsed by a pulser in one of the two irradiation methods, and applying the irradiation light that is not pulsed in another one of the two irradiation methods.

(Supplementary Note 10)

A control device included by an atomic oscillator, the atomic oscillator including:

a gas cell in which alkali metal atoms are encapsulated;

a light generator that applies an irradiation light having at least two different frequency components to the gas cell;

a light detector that detects a transmitted light having transmitted by the gas cell; and the control device that determines a resonance frequency of the alkali metal atoms based on a light amount of the transmitted light by the gas cell and controls an oscillation frequency based on the determined resonance frequency, the control device controlling to apply the irradiation light by two irradiation methods in which characteristics of change in the resonance frequency due to change in intensity of the irradiation light are different from each other, and the control device controlling the oscillation frequency based on a result of comparison between the resonance frequencies when the irradiation light is applied to the gas cell by the two irradiation methods, respectively.

(Supplementary Note 11)

A computer program comprising instructions for causing a control device included by an atomic oscillator to execute processes, the atomic oscillator including:

a gas cell in which alkali metal atoms are encapsulated;

a light generator that applies an irradiation light having at least two different frequency components to the gas cell;

a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency, the processes being to:

apply the irradiation light by two irradiation methods in which characteristics of change in the resonance frequency due to change in intensity of the irradiation light are different from each other, and control the oscillation frequency based on a result of comparison between the resonance frequencies when the irradiation light is applied to the gas cell by the two irradiation methods, respectively.

DESCRIPTION OF REFERENCE NUMERALS 1 light generator
11 laser
12 pulser
2 gas cell
3 light detector
4 controller
41 resonance frequency and shift amount calculator
42 current modulator controller
43 laser controller
44 frequency converter controller
45 VCXO controller
51 VCXO
52 frequency converter
53 current modulator
100 atomic oscillator
101 gas cell
102 light generator
103 light detector
104 controller

The invention claimed is:

1. An atomic oscillator comprising:

a gas cell in which alkali metal atoms are encapsulated;

a light generator that applies an irradiation light having at least two different frequency components to the gas cell;

a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency, wherein:

the irradiation light is applied by two irradiation methods in which characteristics of change in the resonance frequency due to change in intensity of the irradiation light are different from each other;

the controller controls the oscillation frequency based on a result of comparison between the resonance frequencies when the irradiation light is applied to the gas cell by the two irradiation methods, respectively; and a pulser that pulses the irradiation light, wherein at least one of the two irradiation methods is to apply the irradiation light pulsed by the pulser.

2. The atomic oscillator according to claim 1, wherein one of the two irradiation methods is to apply the irradiation light pulsed by the pulser and another one of the two irradiation methods is to apply the irradiation light that is not pulsed.

3. The atomic oscillator according to claim 1, wherein one of the two irradiation methods is to apply a first irradiation light pulsed by the pulser and another one of the two irradiation methods is to apply a second irradiation light pulsed by the pulser at a different duty cycle from that of the first irradiation light.

4. The atomic oscillator according to claim 1, wherein the controller controls the oscillation frequency based on a difference in the resonance frequency when the irradiation light is applied to the gas cell by the two irradiation methods, respectively.

5. The atomic oscillator according to claim 4, wherein the controller calculates a variation amount of the resonance frequency of the alkali metal atoms due to a change in intensity of the irradiation light based on the difference in the resonance frequency when the irradiation light is applied to the gas cell by the two irradiation methods, respectively, and controls the oscillation frequency in accordance with the calculated variation amount.

6. The atomic oscillator according to claim 4, wherein the controller controls the oscillation frequency based on the resonance frequency of the alkali metal atoms and a preset first parameter, and also changes the first parameter based on the difference in the resonance frequency when the irradiation light is applied to the gas cell by the two irradiation methods, respectively, and controls the oscillation frequency based on the changed first parameter and the resonance frequency.

7. The atomic oscillator according to claim 4, wherein the controller controls to generate a reference signal to be a reference of the irradiation light based on the oscillation frequency and a preset second parameter, and also changes the second parameter based on the difference in the resonance frequency when the irradiation light is applied to the gas cell by the two irradiation methods, respectively, and controls to generate the reference signal based on the changed second parameter and the oscillation frequency.

8. A control method by an atomic oscillator, the atomic oscillator including:

a gas cell in which alkali metal atoms are encapsulated;

a light generator that applies an irradiation light having at least two different frequency components to the gas cell;

a light detector that detects a transmitted light having transmitted by the gas cell; and a controller that determines a resonance frequency of the alkali metal atoms based on a light amount of the transmitted light by the gas cell and controls an oscillation frequency based on the determined resonance frequency, the control method comprising:

applying the irradiation light by two irradiation methods in which characteristics of change in the resonance frequency due to change in intensity of the irradiation light are different from each other;

by the controller, controlling the oscillation frequency based on a result of comparison between the resonance frequencies when the irradiation light is applied to the gas cell by the two irradiation methods, respectively; and applying the irradiation light pulsed by a pulser in at least one of the two irradiation methods.

9. The control method according to claim 8, comprising applying the irradiation light pulsed by a pulser in one of the two irradiation methods, and applying the irradiation light that is not pulsed in another one of the two irradiation methods.

10. A control device included by an atomic oscillator, the atomic oscillator including:

a gas cell in which alkali metal atoms are encapsulated;

a light generator that applies an irradiation light having at least two different frequency components to the gas cell;

a light detector that detects a transmitted light having transmitted by the gas cell; and the control device that determines a resonance frequency of the alkali metal atoms based on a light amount of the transmitted light by the gas cell and controls an oscillation frequency based on the determined resonance frequency, the control device controlling to apply the irradiation light by two irradiation methods in which characteristics of change in the resonance frequency due to change in intensity of the irradiation light are different from each other, and the control device controlling the oscillation frequency based on a result of comparison between the resonance frequencies when the irradiation light is applied to the gas cell by the two irradiation methods, respectively; and applying the irradiation light pulsed by a pulser in at least one of the two irradiation methods.

\* \* \* \* \*